US008889470B2

(12) United States Patent
Kim et al.

(10) Patent No.: US 8,889,470 B2
(45) Date of Patent: Nov. 18, 2014

(54) THIN FILM TYPE SOLAR CELL AND METHOD FOR MANUFACTURING THE SAME

(75) Inventors: Jae Ho Kim, Yongin-si (KR); Chul Ju Hwang, Gwangju-si (KR)

(73) Assignee: Jusung Engineering Co., Ltd., Gwangju (KR)

( * ) Notice: Subject to any disclaimer, the term of this patent is extended or adjusted under 35 U.S.C. 154(b) by 1059 days.

(21) Appl. No.: 12/456,121

(22) Filed: Jun. 11, 2009

(65) Prior Publication Data
US 2009/0308436 A1    Dec. 17, 2009

(30) Foreign Application Priority Data
Jun. 13, 2008   (KR) ................. 10-2008-0055585

(51) Int. Cl.
*H01L 21/00* (2006.01)
*H01L 31/00* (2006.01)
*H01L 27/142* (2014.01)
*H01L 31/05* (2014.01)

(52) U.S. Cl.
CPC ............ *H01L 31/05* (2013.01); *Y02E 10/50* (2013.01); *H01L 27/1423* (2013.01)
USPC ............. 438/98; 136/252; 257/E31.126

(58) Field of Classification Search
CPC ...... H01L 27/1423; H01L 31/05; Y02E 10/50
USPC ............. 438/98; 136/252; 257/E31.126
See application file for complete search history.

(56) References Cited

U.S. PATENT DOCUMENTS

| 4,243,432 A | * | 1/1981 | Jordan et al. | 136/244 |
| 4,667,058 A | * | 5/1987 | Catalano et al. | 136/244 |
| 4,697,041 A | | 9/1987 | Okaniwa et al. | |
| 5,131,954 A | * | 7/1992 | Vogeli et al. | 136/244 |
| 5,421,908 A | * | 6/1995 | Yoshida et al. | 136/244 |
| 5,593,901 A | * | 1/1997 | Oswald et al. | 438/80 |

(Continued)

FOREIGN PATENT DOCUMENTS

| CN | 1674777 A | 9/2005 |
| KR | 10-1994-0006714 | 4/1994 |

OTHER PUBLICATIONS

English Machine translation of Report of Prior Art Search for Korean patent application No. 10200800055585 dated Apr. 18, 2014.*

(Continued)

*Primary Examiner* — Tamir Ayad
(74) *Attorney, Agent, or Firm* — Andrew D. Fortney; Central California IP Group, P.C.

(57) ABSTRACT

A thin film type solar cell and a method for manufacturing the same is disclosed, wherein the method comprises sequentially depositing a front electrode layer and a semiconductor layer on a substrate; forming a first separating channel by removing predetermined portions of the front electrode layer and the semiconductor layer; forming a contact portion and a second separating channel by removing predetermined portions of the semiconductor layer; forming a first insulating layer in the first separating channel; and forming a plurality of rear electrodes at fixed intervals by each second separating channel interposed in-between, wherein each rear electrode is electrically connected with the front electrode layer through the contact portion. The present invention needs only one cleaning process after carrying out the laser-scribing process, whereby the yield can be improved owing to the simplified manufacturing process. According to the present invention, there is no need to alternately load the substrate to the vacuum-deposition apparatus and the laser-scribing apparatus, whereby the apparatus structure is simple and the manufacturing time is decreased, thereby resulting in the improved yield.

20 Claims, 4 Drawing Sheets

(56) References Cited

U.S. PATENT DOCUMENTS

| | | |
|---|---|---|
| 7,845,071 B2 | 12/2010 | Morooka et al. |
| 2005/0210666 A1 | 9/2005 | Morooka et al. |
| 2009/0056801 A1* | 3/2009 | Chun-Hsiung et al. ....... 136/256 |

OTHER PUBLICATIONS

English Machine translation of Notification of reason for refusal for for Korean patent application No. 10200800055585 dated Apr. 18, 2014.*

Hisao Morooka, Hideaki Ninomiya, Junichi Shimamura and Kazuo Nishi; "Substrate Holding Method and Method of Manufacturing Electronic Part"; SIPO English Patent Detail; Publication No. 1674777; Publication Date: Sep. 28, 2005; The State Intellectual Property Office of P.R.C., People's Republic of China.

Taiwanese Office Action dated Jul. 23, 2012; Taiwan Patent Application No. 098119459; 6 pages; Taiwan Patent Office, Taiwan R.O.C. Office Action for Korean Patent Application No. 10-2008-0055585; Dated Apr. 18, 2014.

* cited by examiner

FIG.5

THIN FILM TYPE SOLAR CELL AND METHOD FOR MANUFACTURING THE SAME

CROSS REFERENCE TO RELATED APPLICATIONS

This application claims the benefit of the Korean Patent Application No. P2008-0055585, filed on Jun. 13, 2008, which is hereby incorporated by reference as if fully set forth herein.

BACKGROUND OF THE INVENTION

1. Field of the Invention

The present invention relates to a thin film type solar cell, and more particularly, to a thin film type solar cell with a plurality of unit cells connected in series.

2. Discussion of the Related Art

A solar cell with a property of semiconductor converts a light energy into an electric energy.

A structure and principle of the solar cell according to the related art will be briefly explained as follows. The solar cell is formed in a PN-junction structure where a positive (P)-type semiconductor makes a junction with a negative (N)-type semiconductor. When a solar ray is incident on the solar cell with the PN-junction structure, holes (+) and electrons (−) are generated in the semiconductor owing to the energy of the solar ray. By an electric field generated in a PN-junction area, the holes (+) are drifted toward the P-type semiconductor and the electrons (−) are drifted toward the N-type semiconductor, whereby an electric power is produced with an occurrence of electric potential.

The solar cell can be largely classified into a wafer type solar cell and a thin film type solar cell.

The wafer type solar cell uses a wafer made of a semiconductor material such as silicon. In the meantime, the thin film type solar cell is manufactured by forming a semiconductor in type of a thin film on a glass substrate.

With respect to efficiency, the wafer type solar cell is better than the thin film type solar cell. However, in the case of the wafer type solar cell, it is difficult to realize a small thickness due to difficulty in performance of the manufacturing process. In addition, the wafer type solar cell uses a high-priced semiconductor substrate, whereby its manufacturing cost is increased.

Even though the thin film type solar cell is inferior in efficiency to the wafer type solar cell, the thin film type solar cell has advantages such as realization of thin profile and use of low-priced material. Accordingly, the thin film type solar cell is suitable for a mass production.

The thin film type solar cell is manufactured by sequential steps of forming a front electrode on a glass substrate, forming a semiconductor layer on the front electrode, and forming a rear electrode on the semiconductor layer. In this case, since the front electrode corresponds to a light-incidence face, the front electrode is made of a transparent conductive material, for example, ZnO. With the increase in size of substrate, a power loss increases due to a resistance of the transparent conductive layer.

Thus, a method for minimizing the power loss has been proposed, in which the thin film type solar cell is divided into a plurality of unit cells connected in series. This method enables the minimization of power loss caused by the resistance of the transparent conductive material.

Hereinafter, a related art method for manufacturing a thin film type solar cell with a plurality of unit cells connected in series will be described with reference to FIG. 1(A to F).

FIG. 1(A to F) is a series of cross section views illustrating a related art method for manufacturing a thin film type solar cell with a plurality of unit cells connected in series.

Figure 1A:
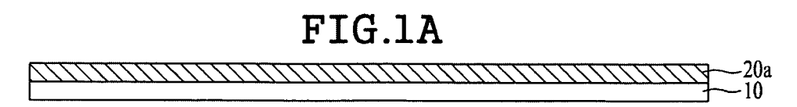

First, as shown in FIG. 1(A), a front electrode layer 20a is formed on a substrate 10, wherein the front electrode layer 20a is formed of a transparent conductive material such as ZnO.

Figure 1B:
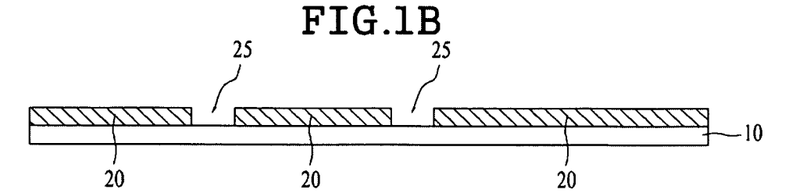

Next, as shown in FIG. 1(B), a plurality of first separating channels 25 are formed by removing predetermined portions of the front electrode layer 20a, so that a plurality of front electrodes 20 are formed at fixed intervals by each first separating channel 25 interposed in-between.

Figure 1C:
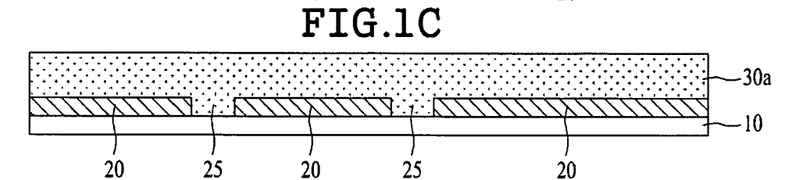

Then, as shown in FIG. 1(C), a semiconductor layer 30a is formed on an entire surface of the substrate 10 including the front electrodes 20.

Figure 1D:
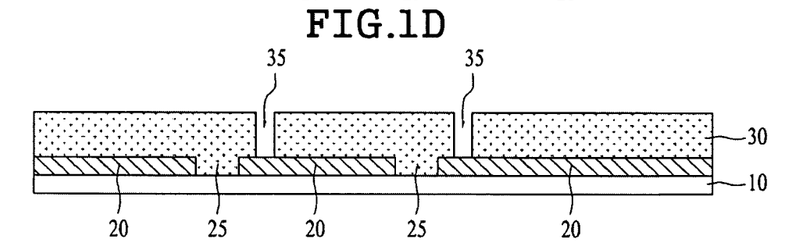

As shown in FIG. 1(D), a plurality of contact portions 35 are formed by removing predetermined portions of the semiconductor layer 30a.

Figure 1E:
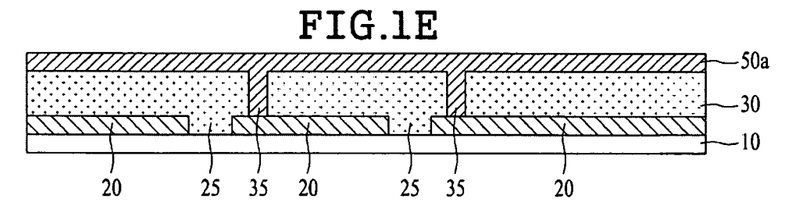

As shown in FIG. 1(E), a rear electrode layer 50a is formed on the entire surface of the substrate 10.

Figure 1F:
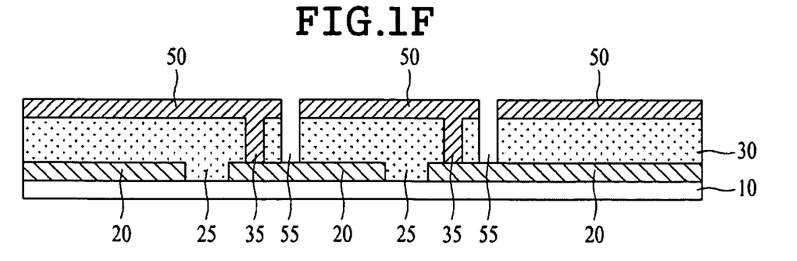

As shown in FIG. 1(F), a plurality of second separating channels 55 are formed by removing predetermined portions of the rear electrode layer 50a and the semiconductor layer 30a. Thus, a plurality of rear electrodes 50 are formed at fixed intervals by each second separating channel 55 interposed in-between, wherein each rear electrode 50 is electrically connected with the front electrode 20 by the contact portion 35. According as each rear electrode 50 is electrically connected with the front electrode 20 by the contact portion 35, the thin film type solar cell is formed in such a structure that a plurality of unit cells are electrically connected in series.

However, the related art method for manufacturing the thin film type solar cell has the following disadvantages.

First, the related art method for manufacturing the thin film type solar cell necessarily requires the total three patterning steps, that is, the patterning step for the first separating channel 25, the patterning step for the contact portion 35, and the patterning step for the second separating channel 55. These patterning steps are respectively performed by a laser-scribing process. In this case, the remnant may remain in the substrate during carrying out the laser-scribing process. Furthermore, if the substrate is contaminated by the remnant, a short may occur between the electrodes due to the remnant, whereby a cleaning process for removing the remnant from the substrate is generally carried out after performing the laser-scribing process. As a result, the cleaning process has to be carried out three times in the case of the related art method for manufacturing the thin film type solar cell which necessarily requires the total three patterning steps. That is, the related art manufacturing method becomes complicated and causes the low yield.

Second, the related art method for manufacturing the thin film type solar cell is comprised of vacuum-conditioned and atmosphere-conditioned processes which are performed alternately, so that a manufacturing apparatus is complicated in its structure, and a manufacturing time is increased, thereby lowering the yield.

To be brief, the related art method for manufacturing the thin film type solar cell is comprised of the process of forming the front electrode layer 20a (the process of FIG. 1(A)), the process of forming the first separating channel 25 (the process of FIG. 1(B)), the process of forming the semiconductor layer 30a (the process of FIG. 1(C)), the process of forming the contact portion 35 (the process of FIG. 1(D)), the process of forming the rear electrode layer 50a (the process of FIG. 1(E)), and the process of forming the second separating channel 55 (the process of FIG. 1(F)).

At this time, the process of forming the front electrode layer 20a (the process of FIG. 1(A)), the process of forming the semiconductor layer 30a (the process of FIG. 1(C)), and the process of forming the rear electrode layer 50a (the process of FIG. 1(E)) are generally performed by using a vacuum-deposition apparatus. Meanwhile, the process of forming the first separating channel 25 (the process of FIG. 1(B)), the process of forming the contact portion 35 (the process of FIG. 1(D)), and the process of forming the second separating channel 55 (the process of FIG. 1(F)) are generally performed by using a laser-scribing apparatus under the atmospheric pressure. In order to complete the related art thin film type solar cell, the substrate 10 has to be alternately loaded into the vacuum-deposition apparatus and the laser-scribing apparatus.

There is a need to prevent the outside air from flowing in the vacuum-deposition apparatus when loading the substrate 10 under the atmospheric pressure into the vacuum-deposition apparatus. Instead of directly loading the substrate 10 into the vacuum-deposition apparatus, the substrate 10 is generally loaded by passing through a road rock chamber so as to prevent the outside air from flowing in the vacuum-deposition apparatus. If the substrate 10 is alternately loaded into the vacuum-deposition apparatus and the laser-scribing apparatus, the apparatus structure becomes complicated due to the road rock chamber. Also, according as the substrate 10 passes through the road rock chamber, a time period for the manufacturing process becomes increased.

SUMMARY OF THE INVENTION

Accordingly, the present invention is directed to a thin film type solar cell and a method for manufacturing the same that substantially obviates one or more problems due to limitations and disadvantages of the related art.

An object of the present invention is to provide a thin film type solar cell and a method for manufacturing the same, which is capable of improving the yield through the simplified manufacturing process by decreasing the total number of cleaning processes performed after a laser-scribing process.

Another object of the present invention is to provide a thin film type solar cell and a method for manufacturing the same, which is capable of simplifying an apparatus structure and shortening a total manufacturing time period by decreasing the total number of alternately loading a substrate into a vacuum-deposition apparatus and a laser-scribing apparatus.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a thin film type solar cell comprises sequentially depositing a front electrode layer and a semiconductor layer on a substrate; forming a first separating channel by removing predetermined portions of the front electrode layer and the semiconductor layer; forming a contact portion and a second separating channel by removing predetermined portions of the semiconductor layer; forming a first insulating layer in the first separating channel; and forming a plurality of rear electrodes at fixed intervals by each second separating channel interposed in-between, wherein each rear electrode is electrically connected with the front electrode layer through the contact portion.

In another aspect of the present invention, a thin film type solar cell comprises a plurality of front electrodes formed on a substrate at fixed intervals by each first separating channel interposed in-between; a semiconductor layer formed on the front electrode and provided with a contact portion and a second separating channel; a first insulating layer formed in the first separating channel; and a plurality of rear electrodes formed at fixed intervals by each second separating channel interposed in-between and electrically connected with the front electrodes through the contact portion.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1(A to F) is a series of cross section views illustrating a method for manufacturing a thin film type solar cell according to the related art;

FIG. 2(A to D) is a series of cross section views illustrating a method for manufacturing a thin film type solar cell according to one embodiment of the present invention;

FIG. 3(A to D) is a series of cross section views illustrating a method for manufacturing a thin film type solar cell according to another embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film type solar cell according to the present invention and a method for manufacturing the same will be described with reference to the accompanying drawings.

FIG. 2(A to D) is a series of cross section views illustrating a method for manufacturing a thin film type solar cell according to one embodiment of the present invention.

Figure 2A:
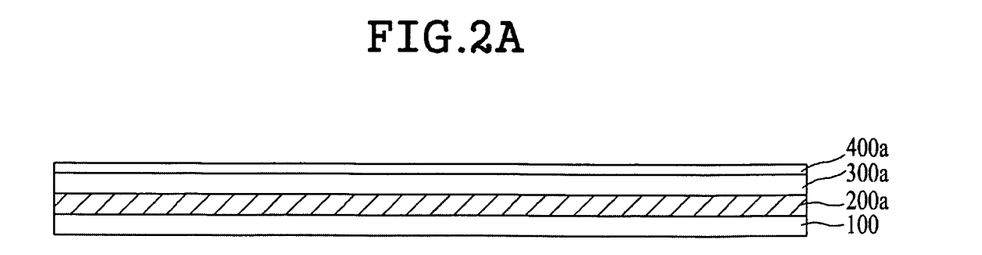

First, as shown in FIG. 2(A), a front electrode layer 200a, a semiconductor layer 300a, and a transparent conductive layer 400a are sequentially deposited on a substrate 100.

The substrate 100 may be formed of glass or transparent plastic.

The front electrode layer 200a may be made of a transparent conductive material, for example, ZnO, ZnO:B, ZnO:Al, $SnO_2$, $SnO_2$:F, or ITO (Indium Tin Oxide). The front electrode layer 200a may be deposited by sputtering or MOCVD (Metal Organic Chemical Vapor Deposition).

The front electrode layer 200a corresponds to a solar-ray incidence face. In this respect, it is important for the front electrode layer 200a to transmit the solar ray into the inside of the solar cell with the maximized absorption of solar ray. For this, the front electrode layer 200a may have an uneven surface which is made by an additionally-applied texturing process. The surface of material layer is provided with the uneven surface, that is, texture structure, through the texturing process, for example, an etching process using photolithography, an anisotropic etching process using a chemical solution, or a groove-forming process using a mechanical scribing. If applying the texturing process to the front electrode layer 200a, a solar-ray reflection ratio on the solar cell is decreased, and a solar-ray absorption ratio into the solar cell is increased owing to a dispersion of the solar ray, thereby improving cell efficiency.

The semiconductor layer 300a may be made of a silicon-based semiconductor material, wherein the semiconductor layer 300a may be formed in a PIN structure where a P-type semiconductor layer, an I-type semiconductor layer, and an N-type semiconductor layer are deposited in sequence. In the semiconductor layer 300a with the PIN structure, depletion is generated in the I-type semiconductor layer by the P-type semiconductor layer and the N-type semiconductor layer, whereby an electric field occurs therein. Thus, electrons and holes generated by the solar ray are drifted by the electric field, and the drifted electrons and holes are collected in the N-type semiconductor layer and the P-type semiconductor layer, respectively. If forming the semiconductor layer 300a with the PIN structure, the P-type semiconductor layer is firstly formed on the front electrode layer 200a, and then the I-type and N-type semiconductor layers are formed thereon, preferably. This is because a drift mobility of the hole is less than a drift mobility of the electron. In order to maximize the efficiency in collection of the incident light, the P-type semiconductor layer is provided adjacent to the light-incidence face.

The transparent conductive layer 400a may be made of a transparent conductive material, for example, ZnO, ZnO:B, ZnO:Al, or Ag. The transparent conductive layer 400a may be deposited by sputtering or MOCVD (Metal Organic Chemical Vapor Deposition). The transparent conductive layer 400a may be omitted. However, in order to improve the cell efficiency, forming the transparent conductive layer 400a is preferable to omitting the transparent conductive layer 400a. This is because the transparent conductive layer 400a enables the solar ray transmitted through the semiconductor layer 300a to be dispersed in all angles, whereby the solar ray is reflected on a rear electrode layer 500a to be described and is then re-incident on the semiconductor layer 300a, thereby resulting in the improved cell efficiency.

Figure 2B:
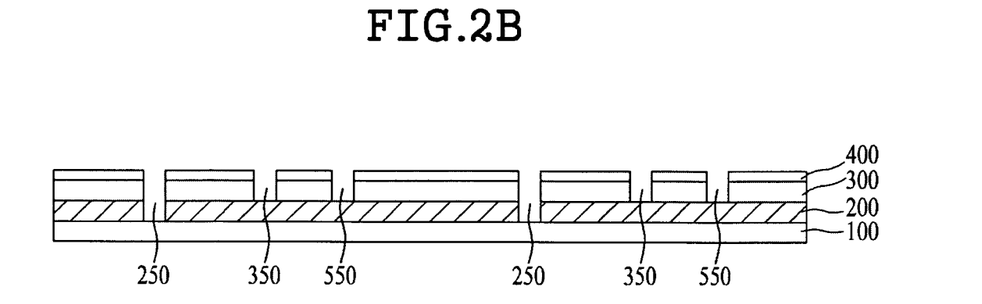

As shown in FIG. 2(B), a first separating channel 250, a contact portion 350, and a second separating channel 550 are formed so as to complete a front electrode pattern 200, a semiconductor layer pattern 300, and a transparent conductive layer pattern 400.

The first separating channel 250 is provided so as to form the front electrode patterns 200 at fixed intervals, so that the thin film type solar cell is divided into unit cells. The first separating channel 250 is formed by removing predetermined portions of the front electrode layer 200a, the semiconductor layer 300a, and the transparent conductive layer 400a.

Figure 2C:
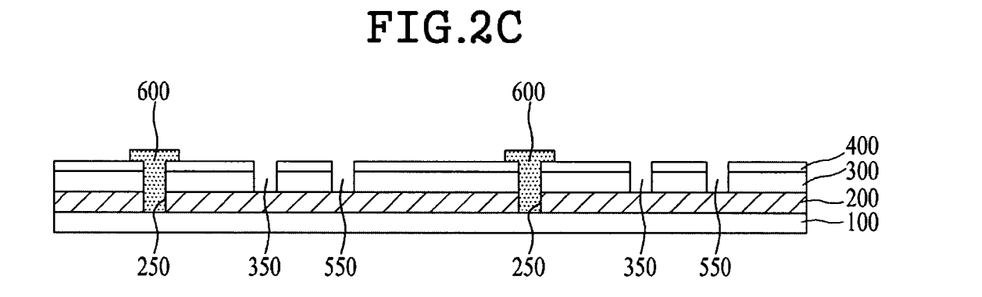
Figure 2D:
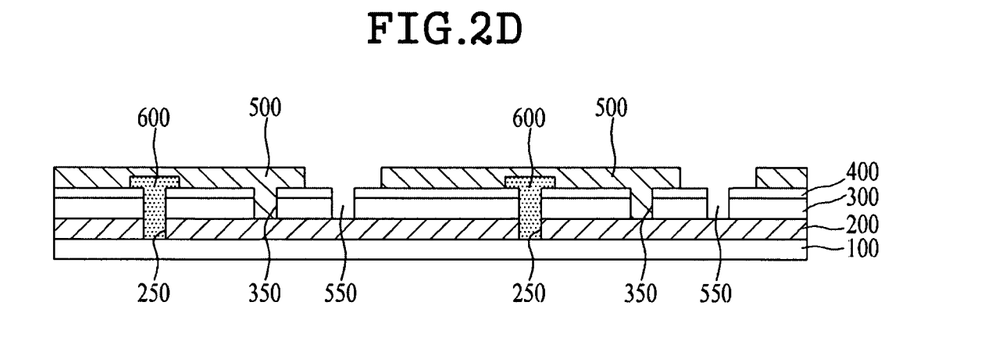

The contact portion 350 exposes a predetermined portion of the front electrode pattern 200 so that a rear electrode pattern to be formed by the following process (See '500' of FIG. 2(D)) is electrically connected with the exposed portion of the front electrode pattern 200. That is, the contact portion 350 functions as a means for connecting the front electrode pattern 200 and the rear electrode pattern to each other. Accordingly, the unit cells are electrically connected in series by the contact portion 350. The contact portion 350 is formed by removing predetermined portions of the semiconductor layer 300a and the transparent conductive layer 400a.

According as the second separating channel 550 is formed between the rear electrode patterns to be formed by the following process (See '500' of FIG. 2(D)), the rear electrode patterns are formed at fixed intervals by each second separating channel 550 interposed in-between, thereby dividing the thin film type solar cell into the unit cells. The second separating channel 550 is formed by removing predetermined portions of the semiconductor layer 300a and the transparent conductive layer 400a.

The first separating channel 250, the contact portion 350, and the second separating channel 550 are formed at fixed intervals, wherein they can be simultaneously formed by a laser-scribing process. Unlike the contact portion 350 and the second separating channel 550, the first separating channel 250 is made by additionally removing the predetermined portion of the front electrode layer 200a. Thus, a wavelength range of first laser for formation of the first separating channel 250 is set to be different from a wavelength range of second laser for formation of the contact portion 350 and the second separating channel 550.

After carrying out the aforementioned process of depositing the front electrode layer 200a, the semiconductor layer 300a, and the transparent conductive layer 400a, the laser-scribing process is carried out so as to form the first separating channel 250, the contact portion 350, and the second separating channel 550. Thus, only one cleaning process is needed after carrying out the laser-scribing process. Unlike the related art, there is no need to alternately load the substrate to a vacuum-deposition apparatus and a laser-scribing apparatus.

As shown in FIG. 2(C), a first insulating layer 600 is formed in the first separating channel 250.

The first insulating layer 600 is provided to prevent the front electrode patterns 200 divided by the unit cells from being electrically connected with one another by the rear electrode patterns to be formed by the following process (See '500' of FIG. 2(D)). That is, during the following process of FIG. 2(D), the rear electrode pattern 500 is formed to be electrically connected with the front electrode pattern 200 through the contact portion 350. In this case, if the rear electrode pattern 500 encroaches on the inside of the first separating channel 250, the neighboring front electrode patterns 200 divided by the unit cells are electrically connected with each other by the rear electrode pattern 500. In order to prevent the front electrode patterns 200 divided by the unit cells from being electrically connected with one another, the first insulating layer 600 is formed in the first separating channel 250.

Since the first insulating layer 600 is provided to prevent the front electrode patterns 200 divided by the unit cells from being electrically connected with one another, it is not necessary to form the first insulating layer 600 entirely inside the first separating channel 250. In the first separating channel 250, the first insulating layer 600 may have a height which is the same as or higher than the front electrode pattern 200. Also, the first insulating layer 600 may be formed on predetermined portions of the transparent conductive layer pattern 400 as well as entirely inside the first separating channel 250.

The first insulating layer 600 may be formed by a printing method, for example, a screen printing method, an inkjet printing method, a gravure printing method, or a micro-contact printing method.

As shown in FIG. 2(D), the rear electrode pattern 500 is formed to be electrically connected with the front electrode pattern 200 through the contact portion 350, thereby completing the thin film type solar cell according to one embodiment of the present invention.

The rear electrode pattern 500 is formed by a printing method, for example, a screen printing method, an inkjet printing method, a gravure printing method, or a micro-contact printing method. The rear electrode pattern 500 is made by using metal paste, for example, Ag, Al, Ag+Mo, Ag+Ni, or Ag+Cu. Also, the rear electrode patterns 500 are formed at fixed intervals by each second separating channel 550 interposed in-between.

FIG. 3(A to D) is a series of cross section views illustrating a method for manufacturing a thin film type solar cell according to another embodiment of the present invention. Except that there is an additional process of forming a second insulating layer 650 in a second separating channel 550 before forming a rear electrode pattern 500, the method to be explained with reference to FIG. 3(A to D) is identical to the method explained with reference to FIG. 2(A to D). Thus, wherever possible, the same reference numbers will be used throughout the drawings to refer to the same or like parts as those of the aforementioned embodiment, and the detailed explanation for the same or like parts will be omitted.

Figure 3A:
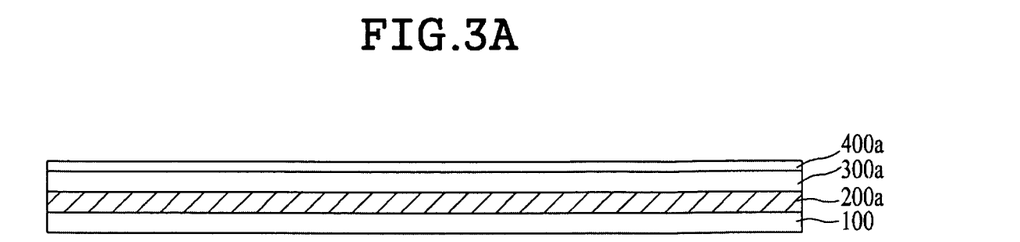

First, as shown in FIG. 3(A), a front electrode layer 200a, a semiconductor layer 300a, and a transparent conductive layer 400a are sequentially deposited on a substrate 100.

Figure 3B:
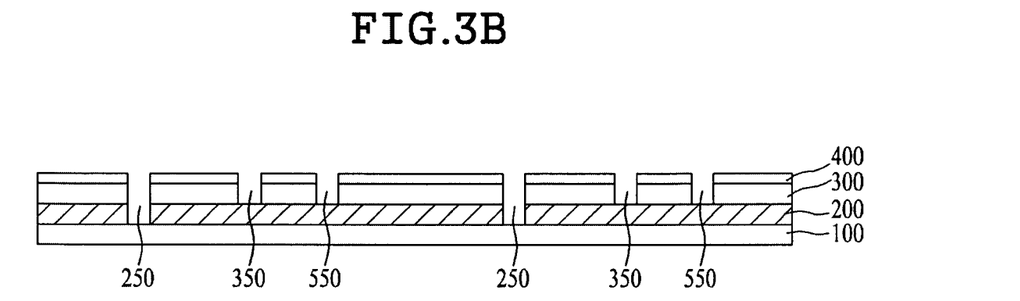

Then, as shown in FIG. 3(B), a first separating channel 250, a contact portion 350, and a second separating channel 550 are formed so as to complete a front electrode pattern 200, a semiconductor layer pattern 300, and a transparent conductive layer pattern 400.

Figure 3C:
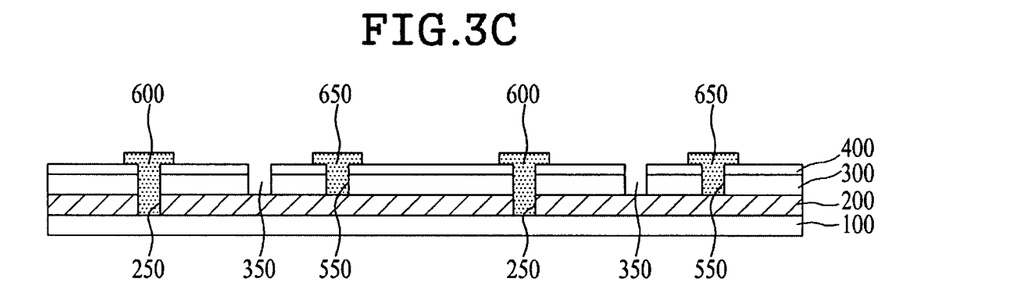

As shown in FIG. 3(C), a first insulating layer 600 is formed in the first separating channel 250, and the second insulating layer 650 is formed in the second separating channel 550.

As mentioned above, the first insulating layer 600 is provided to prevent the front electrode patterns 200 divided by unit cells from being electrically connected with one another. The second insulating layer 650 is provided to perfectly insulate the rear electrode patterns 500 to be formed by the following process from one another. For realizing the precise insulation of the rear electrode patterns 500, the second insulating layer 650 may be formed on predetermined portions of the transparent conductive layer pattern 400 as well as entirely inside the second separating channel 550.

The first and second insulating layers 600 and 650 may be simultaneously formed by a printing method, for example, a screen printing method, an inkjet printing method, a gravure printing method, or a micro-contact printing method.

Figure 3D:
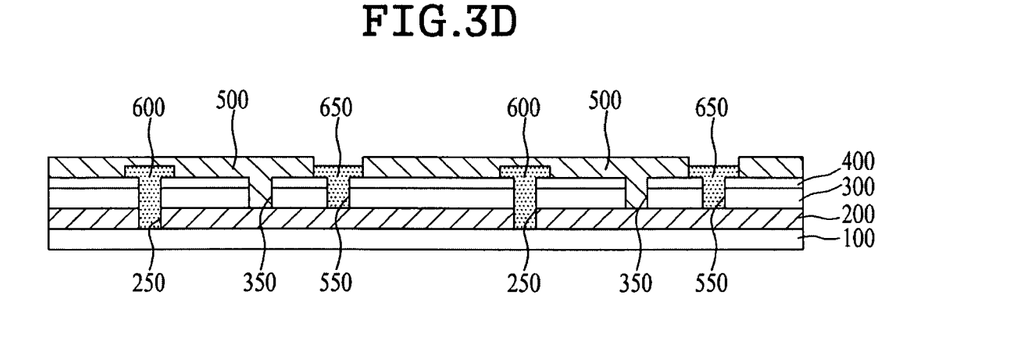

As shown in FIG. 3(D), the rear electrode pattern 500 is formed to be electrically connected with the front electrode pattern 200 through the contact portion 350, thereby completing the thin film type solar cell according to another embodiment of the present invention.

The rear electrode patterns 500 are formed at fixed intervals by each second insulating layer 650 interposed in-between.

Figure 4:
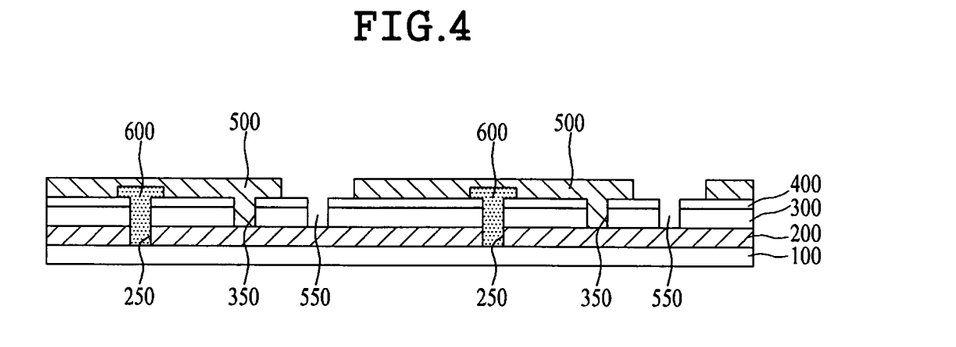
FIG. 4 is a cross section view illustrating a thin film type solar cell according to one embodiment of the present invention.

FIG. 4 is a cross section view illustrating a thin film type solar cell according to one embodiment of the present invention.

As shown in FIG. 4, the thin film type solar cell according to one embodiment of the present invention includes a substrate 100, a front electrode pattern 200, a semiconductor layer pattern 300, a transparent conductive layer pattern 400, a rear electrode pattern 500, and a first insulating layer 600.

The plurality of front electrode patterns 200 are formed on the substrate 100, wherein the plurality of front electrode patterns 200 are formed at fixed intervals by each first separating channel 250 interposed in-between. The front electrode patterns 200 may be formed of a transparent conductive material, for example, ZnO, ZnO:B, ZnO:Al, $SnO_2$, $SnO_2$:F, or ITO (Indium Tin Oxide). In order to maximize absorption of solar ray, each front electrode pattern 200 may have an uneven surface.

The semiconductor layer patterns 300 are formed on the front electrode patterns 200. Each semiconductor layer pattern 300 is provided with the first separating channel 250, a contact portion 350, and a second separating channel 550. In this case, the first separating channel 250, the contact portion 350, and the second separating channel 550 are formed at fixed intervals. Also, the semiconductor layer pattern 300 may be made of a silicon-based semiconductor material, wherein the semiconductor layer pattern 300 may be formed in a PIN structure where a P-type semiconductor layer, an I-type semiconductor layer, and an N-type semiconductor layer are deposited in sequence.

The transparent conductive layer patterns 400 are formed on the semiconductor layer patterns 300, wherein the transparent conductive layer patterns 400 are provided at the same pattern type as the semiconductor layer patterns 300. The transparent conductive layer pattern 400 may be made of a transparent conductive material, for example, ZnO, ZnO:B, ZnO:Al, or Ag. If needed, the transparent conductive layer pattern 400 may be omitted.

The rear electrode patterns 500 are formed on the transparent conductive layer patterns 400, wherein the rear electrode patterns 500 are electrically connected with the front electrode patterns 200 through the respective contact portions 350. In this case, the plurality of rear electrode patterns 500 are formed at fixed intervals by each second separating channel 550 interposed in-between. The rear electrode patterns 500 may be formed of metal, for example, Ag, Al, Ag+Mo, Ag+Ni, or Ag+Cu.

The first insulating layer 600 is formed in the first separating channel 250, wherein the first insulating layer 600 insulates the neighboring front electrode patterns 200 from each other so as to prevent the neighboring front electrode patterns 200 from being electrically connected with each other. Thus, the first insulating layer 600 is formed in the first separating channel 250 such that a height of the first insulating layer 600 is the same as or higher than the front electrode pattern 200. If needed, the first insulating layer 600 may be formed on predetermined portions of the transparent conductive layer pattern 400 as well as entirely inside the first separating channel 250.

Figure 5:
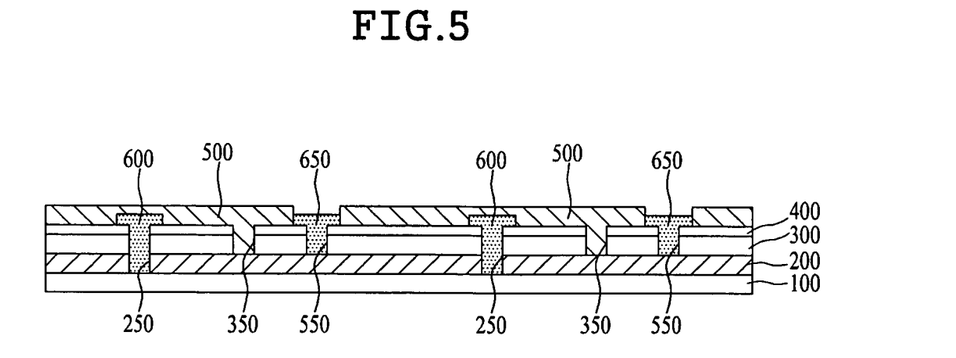
FIG. 5 is a cross section view illustrating a thin film type solar cell according to another embodiment of the present invention.

FIG. 5 is a cross section view illustrating a thin film type solar cell according to another embodiment of the present invention. Except that a second insulating layer 650 is additionally formed in a second separating channel 550, the thin film type solar cell to be described with reference to FIG. 5 is identical in structure to the thin film type solar cell explained with reference to FIG. 4. Thus, wherever possible, the same reference numbers will be used throughout the drawings to refer to the same or like parts as those of the aforementioned embodiment, and the detailed explanation for the same or like parts will be omitted.

The second insulating layer 650 may be formed on predetermined portions of the transparent conductive layer pattern 400 as well as entirely inside the second separating channel 550. Also, the plurality of rear electrode patterns 500 are formed at fixed intervals by each second insulating layer 650 interposed in-between.

The aforementioned thin film type solar cells explained with reference to FIGS. 4 and 5 may be manufactured by the methods explained with reference to FIG. 2(A to D) and FIG. 3(A to D), however, it is not limited to the aforementioned methods.

Accordingly, the thin film type solar cell according to the present invention and the method for manufacturing the same has the following advantages.

First, the first separating channel 250, the contact portion 350, and the second separating channel 550 can be simultaneously formed by one laser-scribing process without performing the respective processes, thereby decreasing the total time for the laser-scribing process. Also, unlike the related art which requires the cleaning process three times, the present invention needs only one cleaning process after carrying out the laser-scribing process, whereby the yield can be improved owing to the simplified manufacturing process.

After carrying out the process of depositing the front electrode layer 200a, the semiconductor layer 300a, and the transparent conductive layer 400a, the laser-scribing process is performed so as to form the first separating channel 250, the contact portion 350, and the second separating channel 550. Unlike the related art, there is no need to alternately load the substrate to the vacuum-deposition apparatus and the laser-scribing apparatus, whereby the apparatus structure is simple and the manufacturing time is decreased, thereby resulting in the improved yield.

Also, the first insulating layer 600 is formed in the first separating channel 250, and the second insulating layer is formed in the second separating channel 550, so that the insulating property is enhanced between the unit cells, thereby preventing the short from occurring between the electrodes divided by the unit cells.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a thin film type solar cell comprising:
    sequentially depositing a front electrode layer and a semiconductor layer on a substrate;
    forming a first separating channel by removing predetermined portions of the front electrode layer and the semiconductor layer;
    forming one or more contact portions and one or more second separating channels by removing predetermined portions of the semiconductor layer such that a separating portion of the semiconductor layer remains between each contact portion and an adjacent second separating channel;
    after forming the first separating channel, the contact portion(s) and the second separating channel(s), forming a first insulating layer in the first separating channel;
    forming a second insulating layer in the second separating channel; and
    after forming the first and second insulating layers, printing a plurality of rear electrodes over the first separating channel and contact portion(s) and not over the one or more second separating channels, wherein each rear electrode is electrically connected with the front electrode layer through a corresponding contact portion,
    wherein the first insulating layer is configured to block each rear electrode from contacting the front electrode layer through the first separating channel.

2. The method of claim 1, wherein the first insulating layer and the second insulating layer are formed at the same time.

3. The method of claim 1, wherein the second insulating layer is on predetermined portions of the semiconductor layer.

4. The method of claim 1, wherein forming the first separating channel, the one or more contact portions, and the one or more second separating channels comprises laser-scribing.

5. The method of claim 1, further comprising:
    forming a transparent conductive layer between the semiconductor layer and the plurality of rear electrodes, wherein the transparent conductive layer has an identical pattern as the semiconductor layer.

6. The method of claim 1, wherein the first separating channel, the one or more contact portions and the one or more second separating channels are formed simultaneously.

7. The method of claim 4, wherein the first separating channel, the one or more contact portions and the one or more second separating channels are formed simultaneously.

8. The method of claim 4, wherein:
    forming the first separating channel comprises using a laser having a first wavelength; and
    forming the one or more contact portions and the one or more second separating channels comprises using a laser having a second wavelength different from the first wavelength.

9. The method of claim 7, wherein:
    forming the first separating channel comprises using a laser having a first wavelength; and
    forming the one or more contact portions and the one or more second separating channels comprises using a laser having a second wavelength different from the first wavelength.

10. The method of claim 1, wherein the one or more second separating channels are completely filled by the second insulating layer.

11. The method of claim 3, wherein the one or more second separating channels are completely filled by the second insulating layer.

12. The method of claim 1, wherein the front electrode layer comprises ZnO, ZnO:B, ZnO:Al, $SnO_2$, $SnO_2$:F and/or indium tin oxide (ITO).

13. The method of claim 1, wherein forming the front electrode layer comprises sputtering or metal organic chemical vapor deposition (MOCVD).

14. The method of claim 1, wherein the front electrode layer corresponds to a solar ray incident face of the solar cell.

15. The method of claim 1, wherein the front electrode layer has a surface which is sufficiently uneven to increase a dispersion of solar rays within the solar cell relative to an even surface.

16. The method of claim 1, wherein the semiconductor layer has a PIN structure, including a P-type semiconductor layer, an I-type semiconductor layer, and an N-type semiconductor layer.

17. The method of claim 16, wherein the P-type semiconductor layer is closer to a solar ray incident face of the solar cell than the N-type semiconductor layer.

18. The method of claim 1, wherein the plurality of rear electrodes comprise Ag, Al, Ag+Mo, Ag+Ni, and/or Ag+Cu.

19. The method of claim 1, wherein the second insulating layer has a thickness less than that of the plurality of rear electrodes in the contact portion.

20. The method of claim 4, wherein the second insulating layer has a thickness less than that of the plurality of rear electrodes in the contact portion.

* * * * *